(12) United States Patent
Honda

(10) Patent No.: US 7,164,617 B2
(45) Date of Patent: Jan. 16, 2007

(54) MEMORY CONTROL APPARATUS FOR SYNCHRONOUS MEMORY UNIT WITH SWITCHED ON/OFF CLOCK SIGNAL

(75) Inventor: Takao Honda, Yamagata (JP)

(73) Assignee: NEC Electronics Corporation, Kanagawa (JP)

( * ) Notice: Subject to any disclaimer, the term of this patent is extended or adjusted under 35 U.S.C. 154(b) by 134 days.

(21) Appl. No.: 11/073,807

(22) Filed: Mar. 8, 2005

(65) Prior Publication Data
US 2005/0201192 A1  Sep. 15, 2005

(30) Foreign Application Priority Data
Mar. 9, 2004 (JP) .............................. 2004-065414

(51) Int. Cl.
*G11C 8/00* (2006.01)
(52) U.S. Cl. .................. 365/233; 365/236; 365/189.07
(58) Field of Classification Search ................ 365/233, 365/236, 189.07
See application file for complete search history.

(56) References Cited

U.S. PATENT DOCUMENTS 5,751,655 A * 5/1998 Yamazaki et al. .......... 365/233
6,678,832 B1   1/2004 Gotanda

FOREIGN PATENT DOCUMENTS

| JP | 09-180438 | 7/1997 |
| JP | 2000-22279 | 8/2000 |
| KR | 2001-0033509 | 4/2001 |

\* cited by examiner

*Primary Examiner*—David Lam
(74) *Attorney, Agent, or Firm*—Foley & Lardner LLP

(57) ABSTRACT

In a memory control apparatus for controlling a synchronous memory unit, the apparatus receives a source clock signal, switches ON and OFF the source clock signal in accordance with an access request signal to the synchronous memory unit and an idle state with no access request signal, and transmits the switched ON/OFF source clock signal to the synchronous memory unit, so that the switched ON/OFF source clock signal serves as an internal clock signal within the synchronous memory unit.

14 Claims, 15 Drawing Sheets

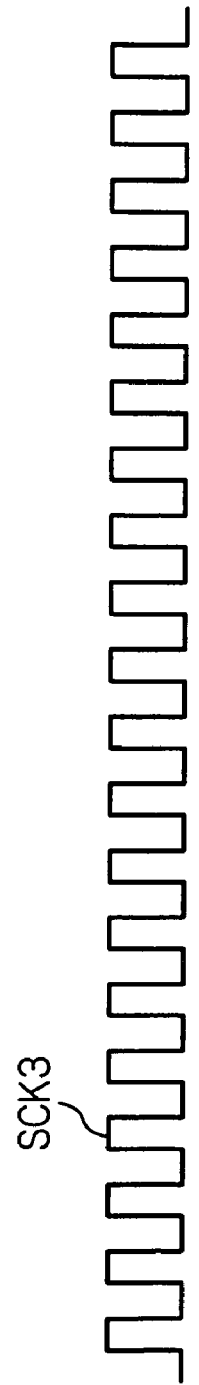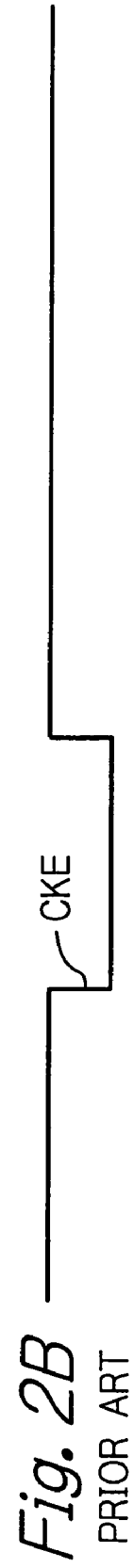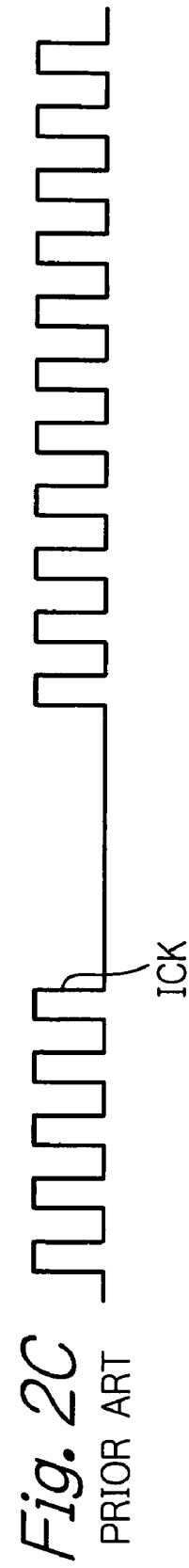
Fig. 2A PRIOR ART
Fig. 2B PRIOR ART
Fig. 2C PRIOR ART

Fig. 4A — SCK
Fig. 4B — ICK

US 7,164,617 B2

MEMORY CONTROL APPARATUS FOR SYNCHRONOUS MEMORY UNIT WITH SWITCHED ON/OFF CLOCK SIGNAL

BACKGROUND OF THE INVENTION

1. Field of the Invention

The present invention relates to a memory control apparatus for controlling a synchronous memory unit or a synchronous dynamic random access (SDRAM) unit.

2. Description of the Related Art

In an SDRAM unit, when an external address signal as well as a command signal such as a read command signal, a write command signal or a refresh command signal is supplied thereto, the external address signal is latched in a burst counter, and thereafter, the content of the burst counter is incremented by receiving a high speed clock signal, so that a burst of read, write or refresh operations are successively carried out in accordance with the incremented content of the burst counter. Therefore, if the clock signals of the SDRAM unit and a host such as a central processing unit (CPU) or a direct memory access (DMA) controller are in common, the read, write or refresh operations can be carried out with no loss of time, and the host can be operated with no wait time.

In a prior art data processing apparatus (see: JP-9-180438-A), a clock signal generator supplies source clock signals to a host, a memory control unit and an SDRAM unit, respectively.

The memory control unit receives an access request signal, an address signal and/or a data signal from the host to generate and transmit a clock enable signal, a command signal such as a read command signal, a write command signal or a refresh command signal, and/or a data signal to the SDRAM unit. As a result, an internal clock signal is generated within the SDRAM unit, so that a burst of read operations, write operations or refresh operations are successively carried out in accordance with the command signal and/or the data signal in synchronization with the internal clock signal. Thus, since the clock enable signal is activated by the access request signal and is inactivated by an idle state which has continued for a time period longer than a predetermined time period for ensuring an overhead, the power consumption of the SDRAM unit can be decreased. This will be explained later in detail.

In the above-described prior art data processing apparatus, however, since a stray capacitance associated with a connection between the clock signal generator and the SDRAM unit is always charged and discharged by the source clock signal, the power consumption dissipated in the above-mentioned stray capacitance is very large, which would increase the power consumption of the entire data processing apparatus.

SUMMARY OF THE INVENTION

It is an object of the present invention to provide a memory control unit used in a data processing apparatus including an SDRAM unit capable of decreasing the power consumption thereof.

Another object is to provide a data processing apparatus including such a memory control unit.

According to the present invention, in a memory control apparatus for controlling a synchronous memory unit, the apparatus receives a source clock signal, switches ON and OFF the source clock signal in accordance with an access request signal to the synchronous memory unit and an idle state with no access request signal, and transmits the switched ON/OFF source clock signal to the synchronous memory unit, so that the switched ON/OFF source clock signal serves as an internal clock signal within the synchronous memory unit.

BRIEF DESCRIPTION OF THE DRAWINGS

The present invention will be more clearly understood from the description set forth below, as compared with the prior art, with reference to the accompanying drawings, wherein:

FIGS. 2A, 2B and 2C are timing diagrams for explaining the operation of the data processing apparatus of FIG. 1;

FIGS. 4A and 4B are timing diagrams for explaining the operation of the data processing apparatus of FIG. 3;

DESCRIPTION OF THE PREFERRED EMBODIMENT

Before the description of the preferred embodiment, a prior art data processing apparatus will be explained with reference to FIG. 1 (see: JP-9-180438-A).

Figure 1:
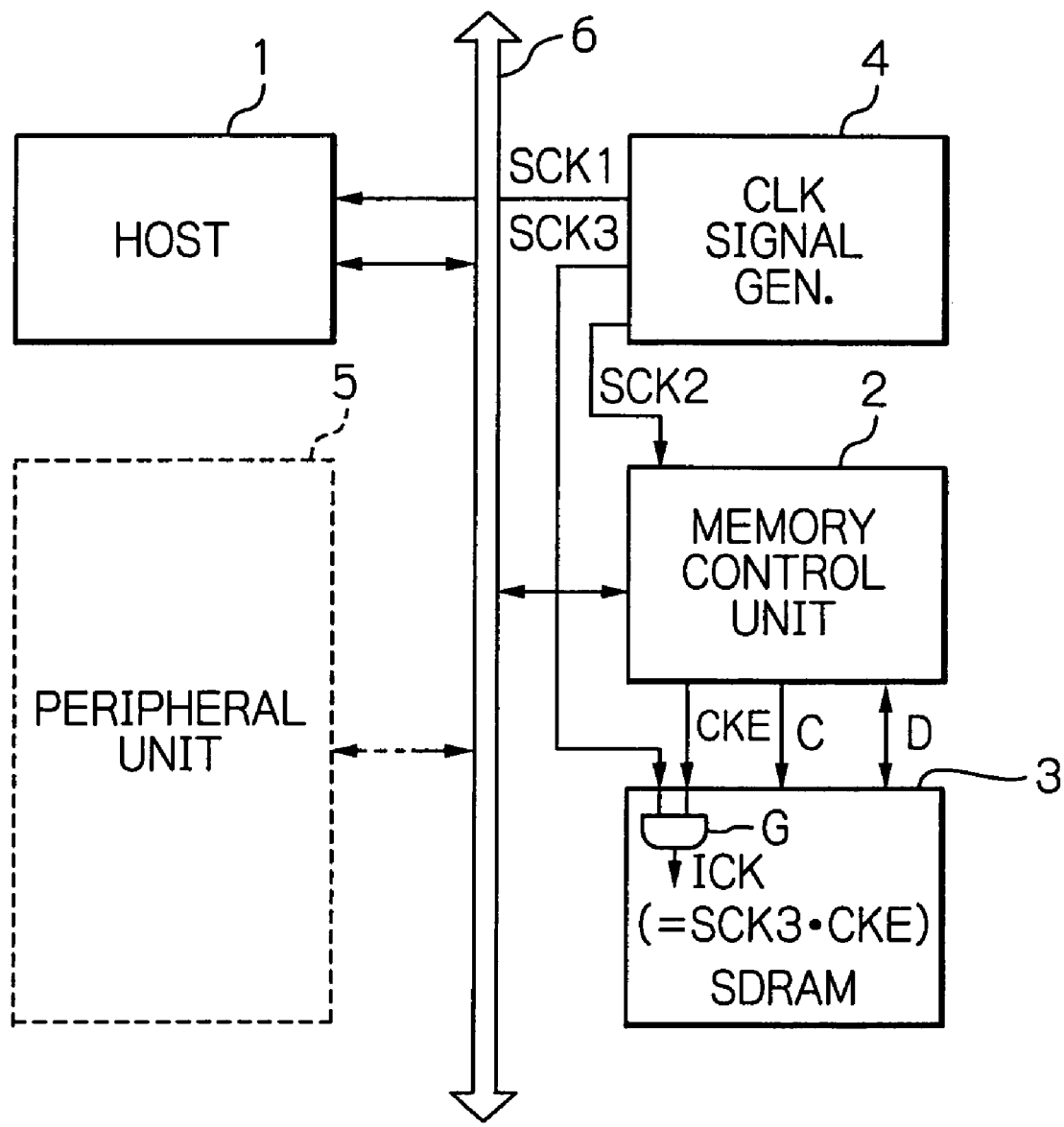
FIG. 1 is a block circuit diagram illustrating a prior art data processing apparatus including a memory control unit and an SDRAM unit.

In FIG. 1, reference numeral 1 designates a host such as a CPU or a DMA controller, reference numeral 2 designates a memory control unit, and 3 designates a synchronous DRAM unit controlled by the memory control unit 2.

Also, a clock signal generator 4 supplies source clock signals SCK1, SCK2 and SCK3 to the host 1, the memory control unit 2 and the SDRAM unit 3, respectively.

Further, a peripheral unit 5 is provided, as occasion demands.

The host 1, the memory control unit 2 and the peripheral unit 5 are connected to each other by a bus 6 for transmission of address signals and data signals.

The memory control unit 2 receives an access request signal, an address signal and/or a data signal via the bus 6 from the host 1 to generate and transmit a clock enable signal CKE, a command signal C such as a read command signal, a write command signal or a refresh command signal, and/or a data signal D to the SDRAM unit 3. As a result, an internal clock signal ICK (=SCK3·CKE) is generated by an AND gate G within the SDRAM unit 3, so that a burst of read operations, write operations or refresh operations are successively carried out in accordance with the command signal C and/or the data signal D in synchronization with the internal clock signal ICK.

If the source clock signal SCK3 and the clock enable signal CKE are as shown in FIGS. 2A and 2B, the internal clock signal ICK is as shown in FIG. 2C. In this case, since the clock enable signal CKE is activated by the access request signal and is inactivated by an idle state which has continued for a time period longer than a predetermined time period for ensuring an overhead, the power consumption of the SDRAM unit 3 can be decreased.

In the data processing apparatus of FIG. 1, however, since a stray capacitance associated with a connection between the clock signal generator 4 and the SDRAM unit 3 is always charged and discharged by the source clock signal SCK3, the power consumption dissipated in the above-mentioned stray capacitance is very large, which would increase the power consumption of the entire data processing apparatus of FIG. 1. Particularly, if the SDRAM unit 3 is far away from the clock signal generator 4 so that the above-mentioned stray capacitance is extremely large, the power consumption would be remarkably increased. Therefore, the clock signal generator 4 is preferably as close as possible to the SDRAM unit 3, in order to decrease the stray capacitance associated with the connection carrying the source clock signal SCK3.

Note that, since the clock signals SCK1 and SCK2 are also always generated from the clock signal generator 4, the clock signal generator 4 is preferably as close as possible to the host 1 and the memory control unit 2, in order to decrease the stray capacitances associated with the connections carrying the source clock signals SCK1 and SCK2.

Figure 3:
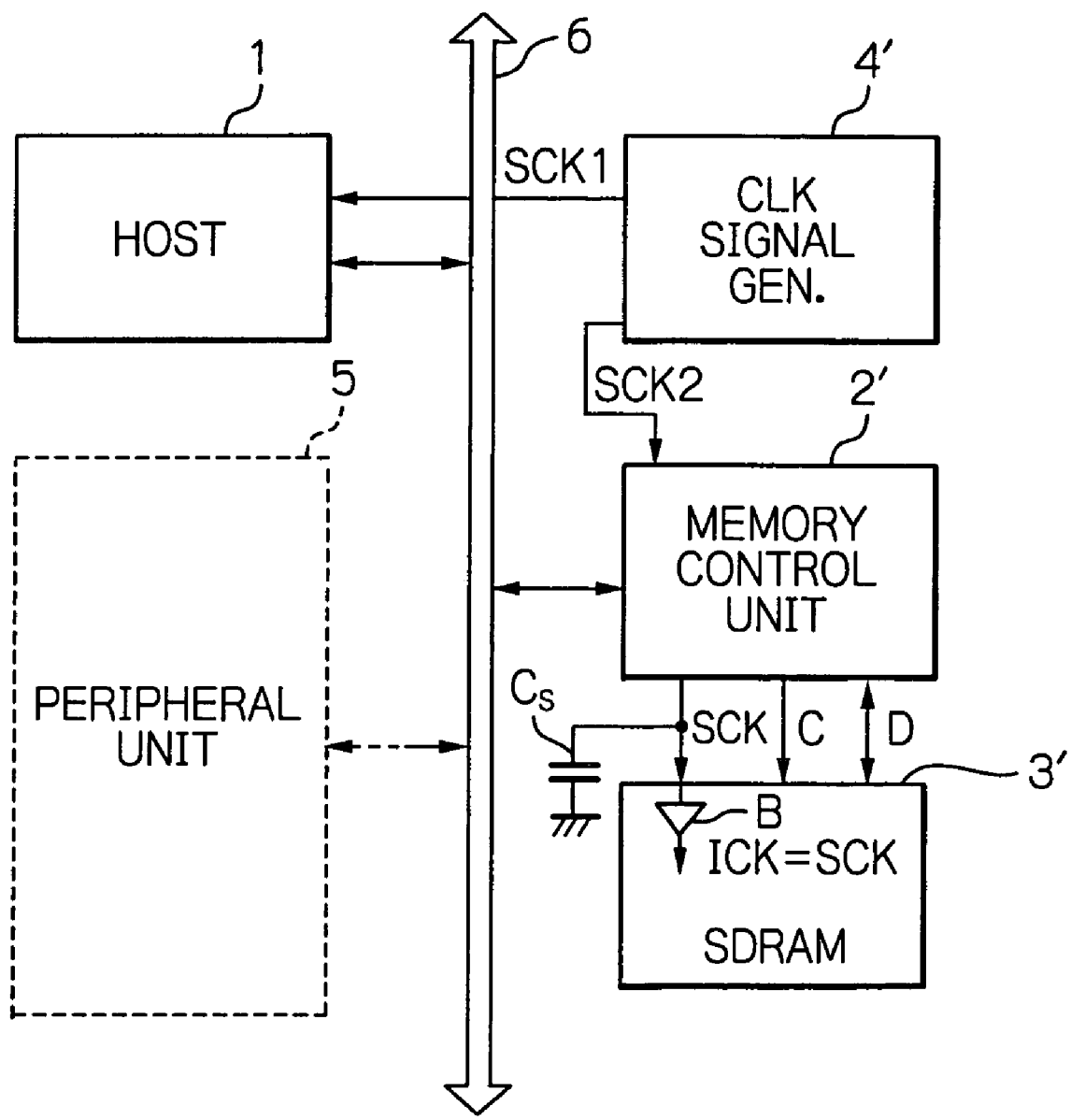
FIG. 3 is a block circuit diagram illustrating an embodiment of data processing apparatus including a memory control unit and an SDRAM unit according to the present invention.

In FIG. 3, which illustrates an embodiment of the data processing apparatus according to the present invention, the memory control unit 2, the SDRAM unit 3 and the clock signal generator 4 of FIG. 1 are replaced by a memory control unit 2', an SDRAM unit 3', and a clock signal generator 4', respectively.

The clock signal generator 4' does not supply the source clock signal SCK3 of FIG. 1 to the SDRAM unit 3'. Also, the memory control unit 2' generates a switched ON/OFF clock signal SCK instead of the clock enable signal CKE of FIG. 1. As a result, the switched ON/OFF clock signal SCK becomes an internal clock signal ICK buffered by a buffer B within the SDRAM unit 3'.

Thus, if the switched ON/OFF clock signal SCK is as shown in FIG. 4A, the internal clock signal ICK is as shown in FIG. 4B. Even in this case, since the switched ON/OFF clock signal SCK (the internal clock signal ICK) is activated by the access request signal and is inactivated by an idle state which has continued for a time period longer than a predetermined time period for ensuring an overhead, the power consumption of the SDRAM unit 3' can be decreased.

Also, since no connection between the clock signal generator 4' and the SDRAM unit 3' to be charged and discharged is provided, the power consumption can be decreased.

In FIG. 3, a stray capacitance CS associated with a connection between the memory control unit 2' and the SDRAM unit 3' is charged and discharged by the switched ON/OFF clock signal SCK. In this case, since the switched ON/OFF clock signal SCK has a substantially higher frequency than the clock enable signal CKE of FIG. 1, the power consumption may be increased. However, since the switched ON/OFF clock signal SCK is fixed after an idle state has continued for a time period longer than the predetermined time period, the power consumption is not so increased.

After all, the power consumption can be deceased.

Figure 5:
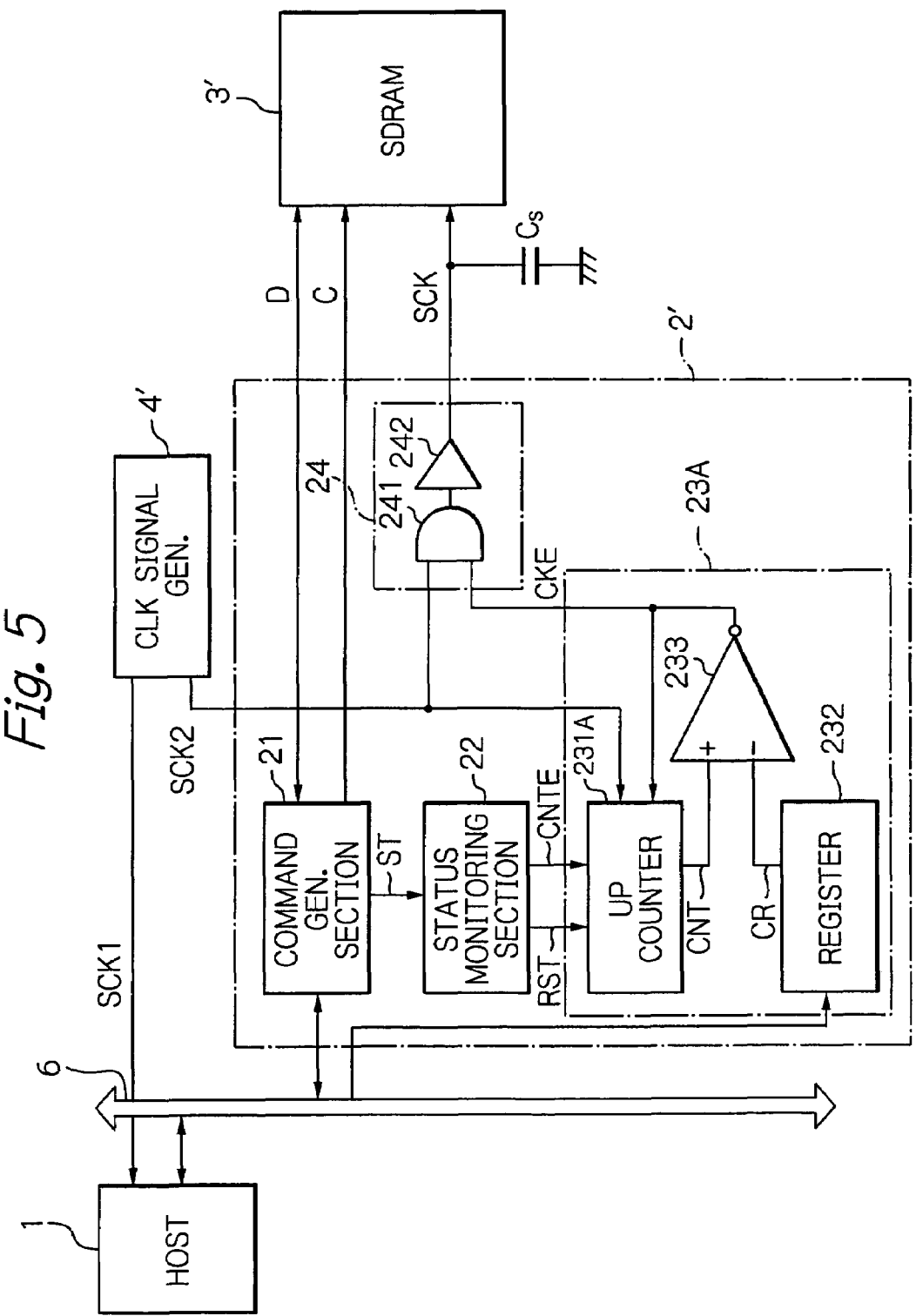
FIG. 5 is a detailed block circuit diagram of a first example of the memory control unit of FIG. 3.

In FIG. 5, which is a detailed block circuit diagram of a first example of the memory control unit 2' of FIG. 3, the memory control unit 2' is constructed by a command generating section 21, a status monitoring section 22, an idle time calculating section 23A, and a switched ON/OFF clock signal generating section 24.

The command generating section 21 receives an access request signal and an address signal via the bus 6 from the host 1 to generate a command signal C such as a read command signal, a write command signal or a refresh command signal and a status signal ST of the SDRAM unit 3' for showing an access status of the SDRAM unit 3'. The command signal C is transmitted to the SDRAM unit 3', and the status signal ST is transmitted to the idle time calculating section 23A. Also, the command generating section 21 performs a transmission of data signals D between the host 1 and the SDRAM unit 3'.

The status monitoring section 22 monitors the status signal ST from the command generating section 21. As a result, when the status signal ST shows an access request state from the host 1 to the SDRAM unit 3', the status monitoring section 22 generates a reset signal RST. On the other hand, when the status signal ST shows an idle state, the status monitoring section 22 generates a count enable signal CNTE. The reset signal RST and the count enable signal CNTE are transmitted to the idle time calculating section 23A.

The idle time calculating section 23A calculates an idle time count CNT for which the count enable signal CNTE is being enabled. The idle time count CNT is reset by the reset signal RST.

The idle time calculating section 23A is constructed by an up counter 231A for counting pulses of the source clock signal SCK2 to generate an idle time count CNT, a register 232 for storing a reference value CR supplied from the host 1, and a comparator 233 for comparing the idle time count CNT with the reference value CR to generate the clock enable signal CKE. In this case, when CNT<CR, the clock enable signal CKE is at a high level (="1"). On the other hand, when CNT≧CR, the clock enable signal CKE is at a low level (="0"). The up counter 231A is incremented by counting pulses of the source clock signal SCK2 when the count enable signal CNTE is being activated (CNTE="1"). Note that, the idle time count CNT of the up counter 231A is reset by the reset signal RST, and the idle time count CNT of the up counter 231A is kept at CR by the inactivated clock enable signal CKE (="0").

The clock signal generating section 24 is constructed by an AND circuit 241 and a buffer 242. When the clock enable signal CKE is activated (="1"), the clock signal generating section 24 passes the source clock signal SCK2 as the switched ON/OFF clock signal SCK. On the other hand, when the clock enable signal CKE is inactivated (="0"), the switched ON/OFF clock signal SCK is fixed at a low level (="0").

The operation of the memory control unit 5 is explained next with reference to FIGS. 6A, 6B, 6C, 6D, 6E, 6F, 6G and 6I. Here, assume that "5" is stored in the register 232 in advance by the host 1, i.e., CR="5".

Figure 6:
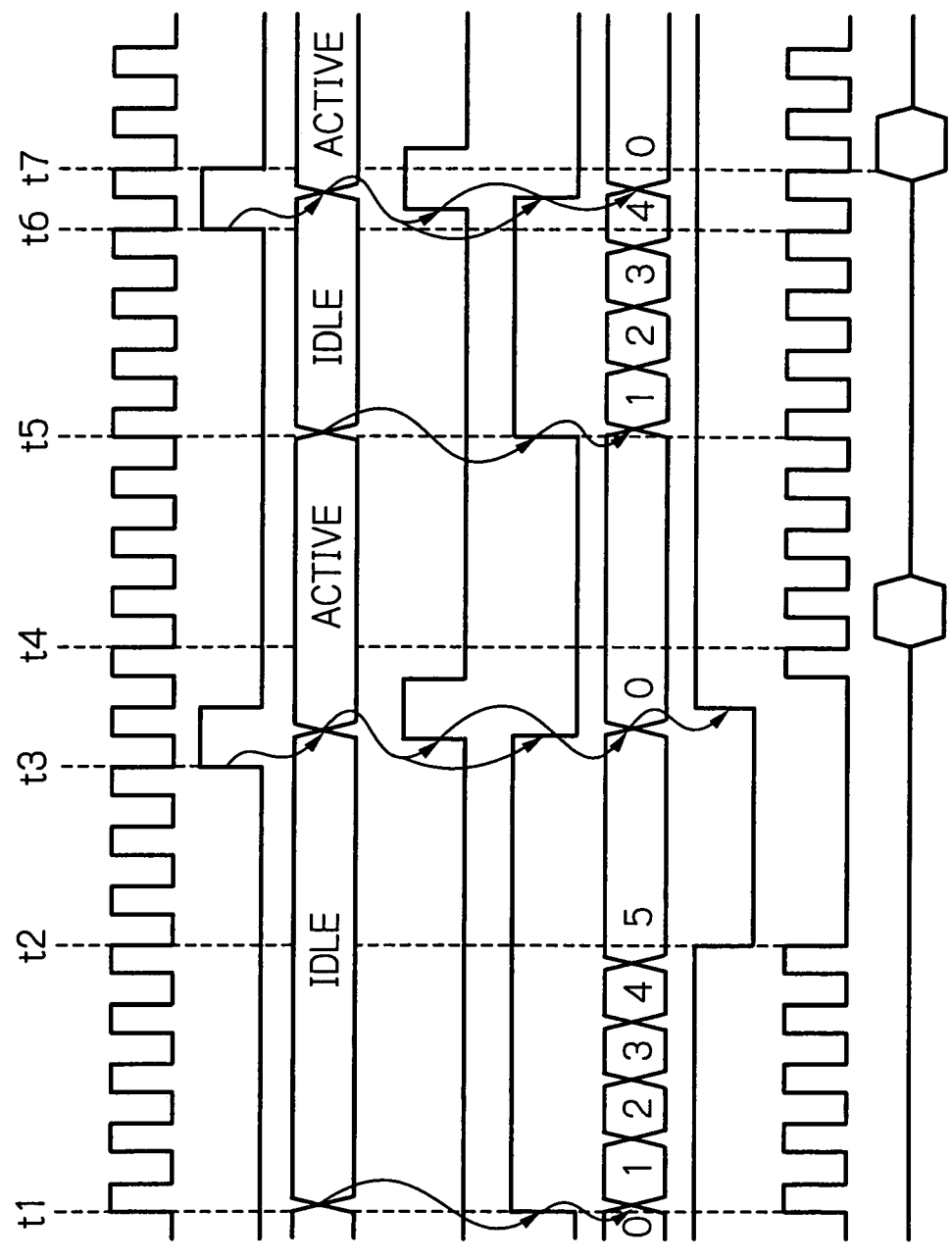
FIGS. 6A through 6I are timing diagrams for explaining the operation of the memory control unit of FIG. 5.

First, at time t1, after an access request signal from the host 1 is processed, the command generating section 21 puts the status signal ST in an idle state as shown in FIG. 6C. As a result, the status monitoring section 22 activates the count enable signal CNTE as shown in FIG. 6E, so that the up counter 231A counts pulses of the source clock signal SCK2 as shown in FIG. 6A to increase the idle time count CNT as shown in FIG. 6F.

Next, at time t2, when the idle time count CNT reaches "5" as shown in FIG. 6F, the clock enable signal CKE is switched from high (="1") to low (="0") as shown in FIG. 6G. As a result, the switched ON/OFF clock signal SCK is switched OFF, i.e., fixed at "0" as shown in FIG. 6I, and simultaneously, the up counter 231A stops its operation, thus maintaining the idle time count CNT at "5".

Next, at time t3, as shown in FIG. 6B, an access request signal from the host 1 occurs. Therefore, the command generating section 21 puts the status signal ST in an active state as shown in FIG. 6C. As a result, the status monitoring section 22 makes the reset signal RST high (="1") as shown in FIG. 6D, and the count enable signal CNTE low (="0") as shown in FIG. 6E, so that the idle time count CNT is reset as shown in FIG. 6F, thus activating the clock enable signal CKE (="1") as shown in FIG. 6G. Thus, as shown in FIG. 6H, the switched ON/OFF clock signal generating section 24 passes the source clock signal SCK2 as the switched ON/OFF clock signal SCK.

Next, at time t4, the command generating section 21 transmits a command signal C to the SDRAM unit 3'. As a result, a burst of read operations, write operations or refresh operations are performed upon the SDRAM unit 3' in accordance with the command signal C.

Next, at time t5, after the access request signal occurring at time t3 is processed, the command generating section 21 puts the status signal ST in an idle state as shown in FIG. 6C. As a result, the status monitoring section 22 activates the count enable signal CNTE as shown in FIG. 6E, so that the up counter 231A counts pulses of the source clock signal SCK2 as shown in FIG. 6A to increase the idle time count CNT as shown in FIG. 6F.

Next, at time t6, before the idle time count CNT reaches "5" as shown in FIG. 6F, an access request signal as shown in FIG. 6B occurs. In this case, the clock enable signal CKE is maintained at a high level (="1") as shown in FIG. 6G. As a result, the switched ON/OFF clock signal SCK is still switched ON, as shown in FIG. 6I. That is, the command generating section 21 puts the status signal ST in an active state as shown in FIG. 6C. As a result, the status monitoring section 22 makes the reset signal RST high (="1") as shown in FIG. 6D, and the count enable signal CNTE low (="0") as shown in FIG. 6E, so that the idle time count CNT is reset as shown in FIG. 6F, so that the clock enable signal CKE is maintained at a high level (="1") as shown in FIG. 6G. Thus, as shown in FIG. 6H, the switched ON/OFF clock signal generating section 24 continues to pass the source clock signal SCK2 as the switched ON/OFF clock signal SCK.

Next, at time t7, the command generating section 21 transmits a command signal C to the SDRAM unit 3'. As a result, a burst of read operations, write operations or refresh operations are performed upon the SDRAM unit 3' in accordance with the command signal C. In this case, since the switched ON/OFF clock signal SCK is not switched OFF, the command signal C can be generated earlier. Therefore, the generation of overhead due to the ON/OFF operations of the switched ON/OFF clock signal SCK can be suppressed.

Figure 7:
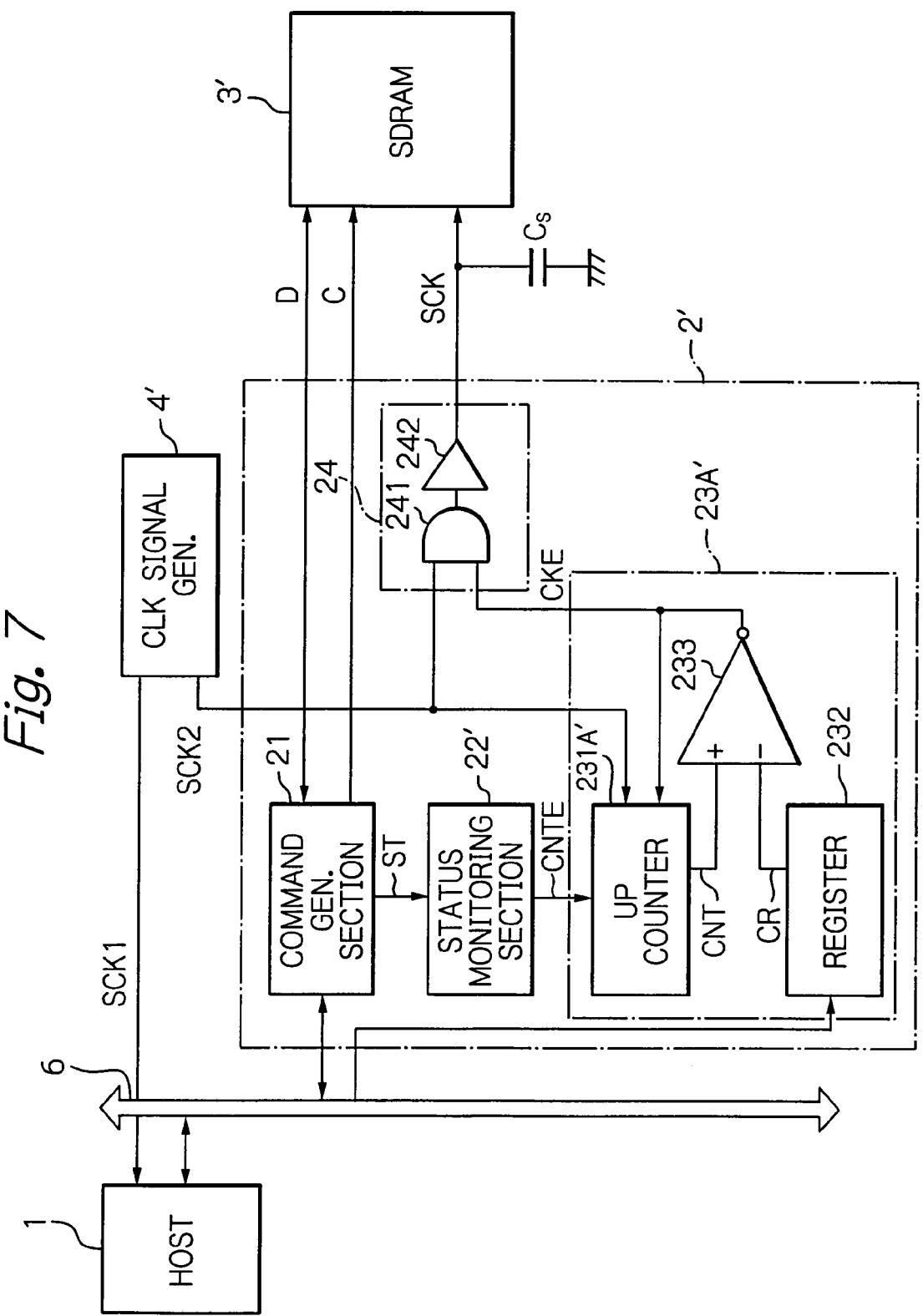
FIG. 7 is a detailed block circuit diagram of a second example of the memory control unit of FIG. 3.

In FIG. 7, which is a detailed block circuit diagram of a second example of the memory control unit 2' of FIG. 3, the status monitoring section 22 of FIG. 5 is replaced by a status monitoring section 22' which generates only the count enable signal CNTE without the reset signal RST, and the idle time calculating section 23 of FIG. 5 is replaced by an idle time calculating section 23A' where the up counter 231A of FIG. 5 is replaced by an up counter 231A' which is reset by the count enable signal CNTE which is at a low level (="0"). The operation of the memory control unit 2' of FIG. 7 is similar to that of FIG. 5.

Figure 8:
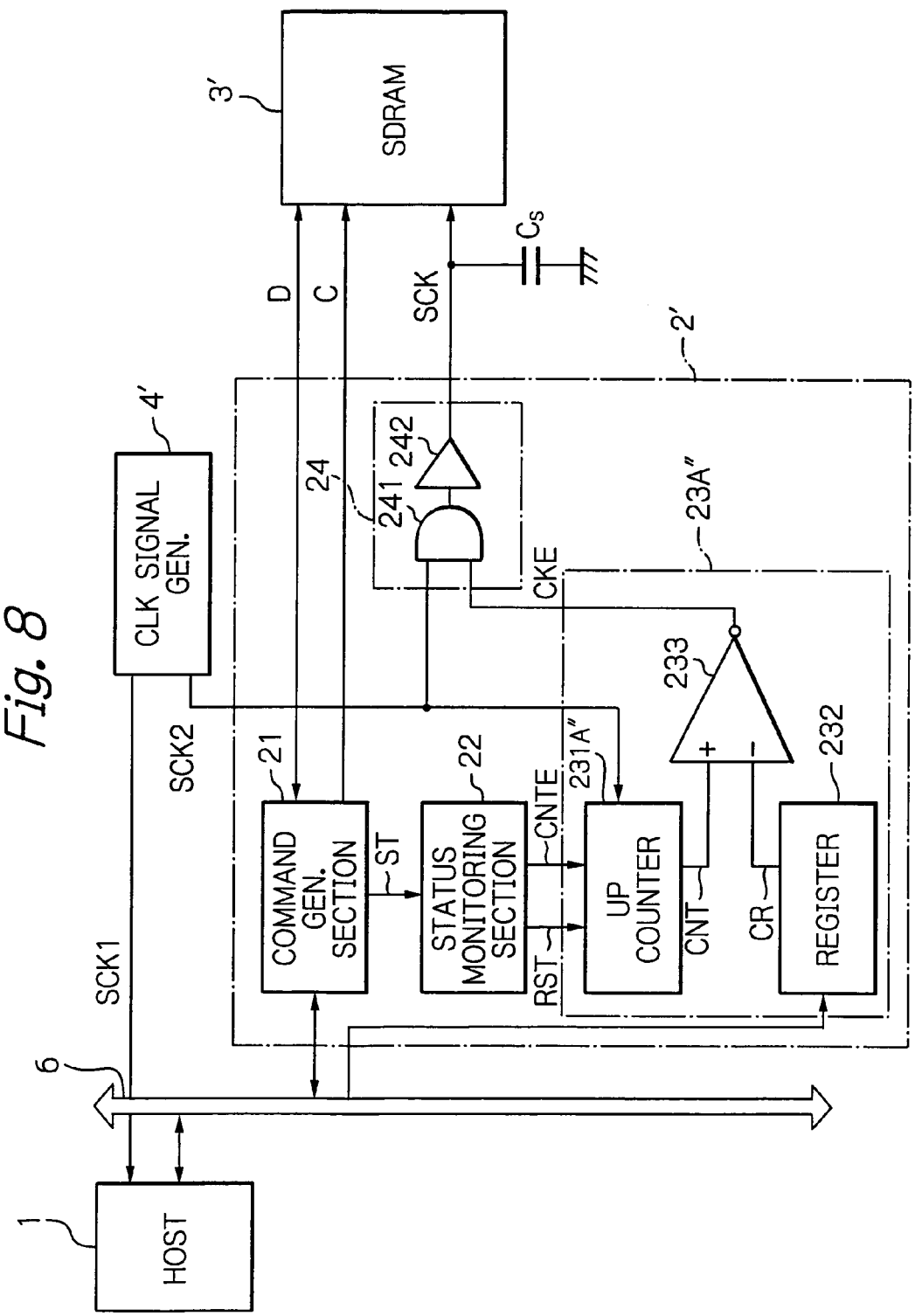
FIG. 8 is a detailed block circuit diagram of a third example of the memory control unit of FIG. 3.
Figure 9:
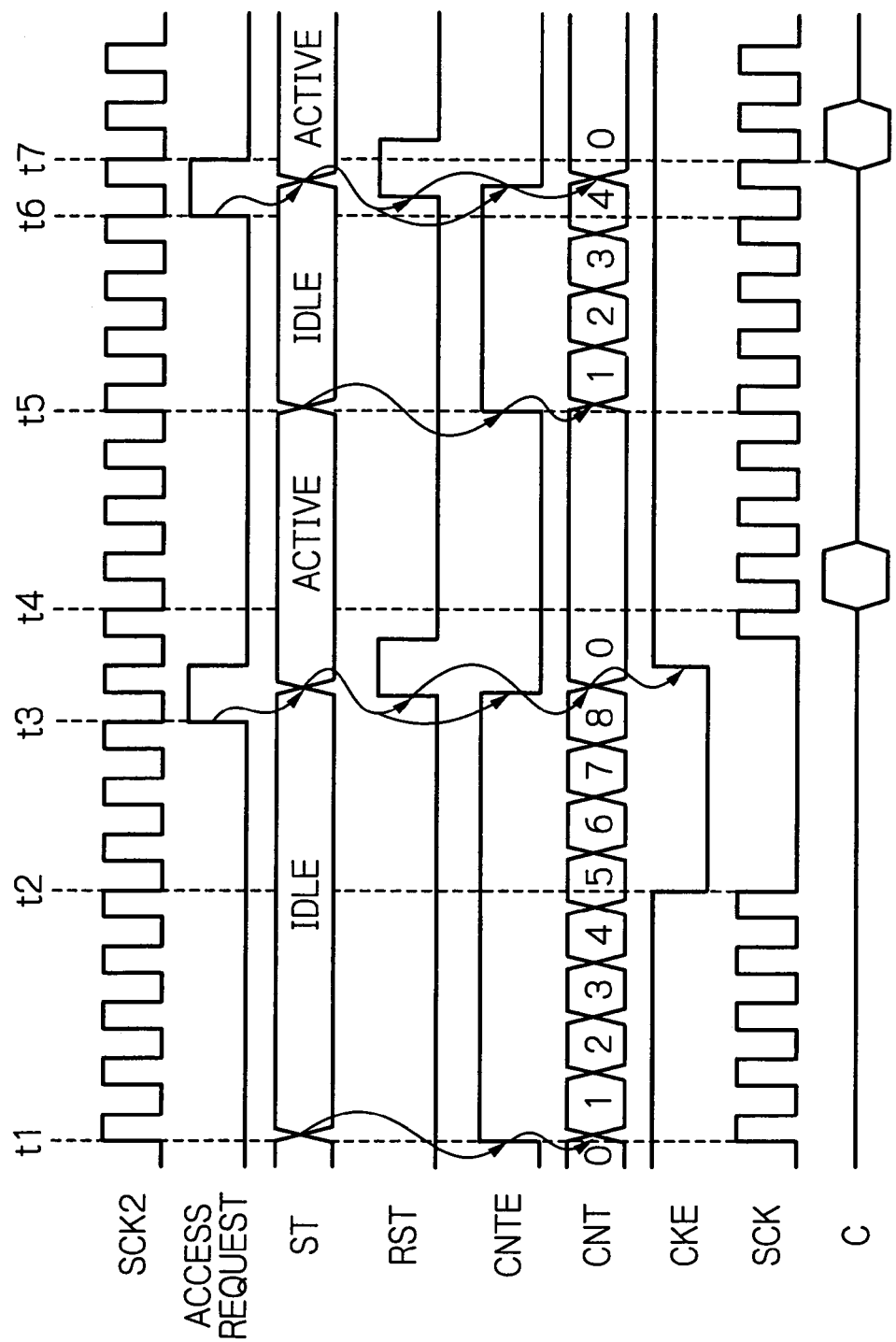
FIGS. 9A through 9I are timing diagrams for explaining the operation of the memory control unit of FIG. 8.

In FIG. 8, which is a detailed block circuit diagram of a third example of the memory control unit 2' of FIG. 3, the idle time calculating section 23A of FIG. 5 is replaced by an idle time calculating section 23A" where the up counter 231A of FIG. 5 is replaced by an up counter 231A" which does not stop its operation even when the clock enable signal CKE which is at a low level (="0"). That is, if the maximum value of the up counter 231A" is much larger than an expected maximum value of the idle time count CNT, the stop operation of the up counter 231A" would be unnecessary. In this case, as shown in FIGS. 9A through 9I, the idle time count CNT continues to increase until the idle time count CNT is reset by the reset signal RST.

Note that a modification portion of the first example of the memory control unit 2' in FIG. 8 can also be applied to the second example of the memory control unit 2' of FIG. 7.

Figure 10:
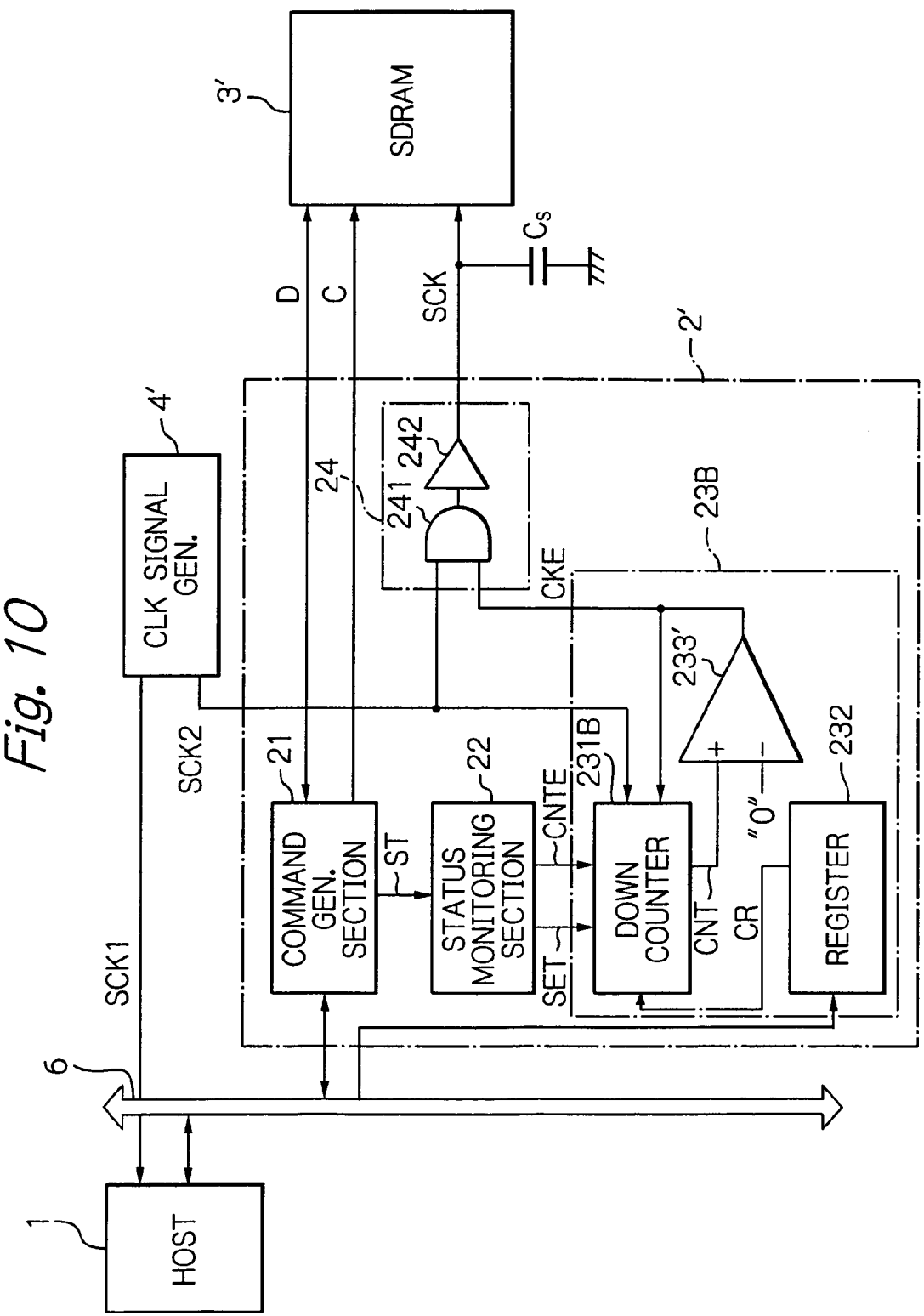
FIG. 10 is a detailed block circuit diagram of a fourth example of the memory control unit of FIG. 3.

In FIG. 10, which illustrates a fourth example of the memory control unit 2' of FIG. 3, the idle time calculating section 23A of FIG. 5 is replaced by an idle time calculating section 23B where the up counter 231A of FIG. 5 is replaced by a down counter 231B. Also, the comparator 233 of FIG. 5 is replaced by a comparator 233'. In this case, the status monitoring section 22 generates a set signal SET corresponding to the reset signal RST of FIG. 5 which sets the reference value CR of the resistor 232 in the down counter 231B. Also, the comparator 233' compares the idle time count CNT with a predetermined value such as "0" to generate the clock enable signal CKE. That is, when CNT>0, the clock enable signal CKE is at a high level (="1"). On the other hand, when CNT≧0, the clock enable signal CKE is at a low level (="0"). The down counter 231B is decremented by counting pulses of the source clock signal SCK2 when the count enable signal CNTE is being activated (CNTE="1"). Note that, the idle time count CNT of the down counter 231B is kept at "0" by the inactivated clock enable signal CKE (="0").

The operation of the memory control unit 5 is explained next with reference to FIGS. 11A, 11B, 11C, 11D, 11E, 11F, 11G and 11I. Here, assume that "5" is stored in the register 232 in advance by the host 1, i.e., CR="5".

First, at time t1, after an access request signal from the host 1 is processed, the command generating section 21 puts the status signal ST in an idle state as shown in FIG. 1C. As a result, the status monitoring section 22 activates the count enable signal CNTE as shown in FIG. 11E, so that the down counter 231B counts pulses of the source clock signal SCK2 as shown in FIG. 11A to decrease the idle time count CNT as shown in FIG. 11F.

Figure 11:
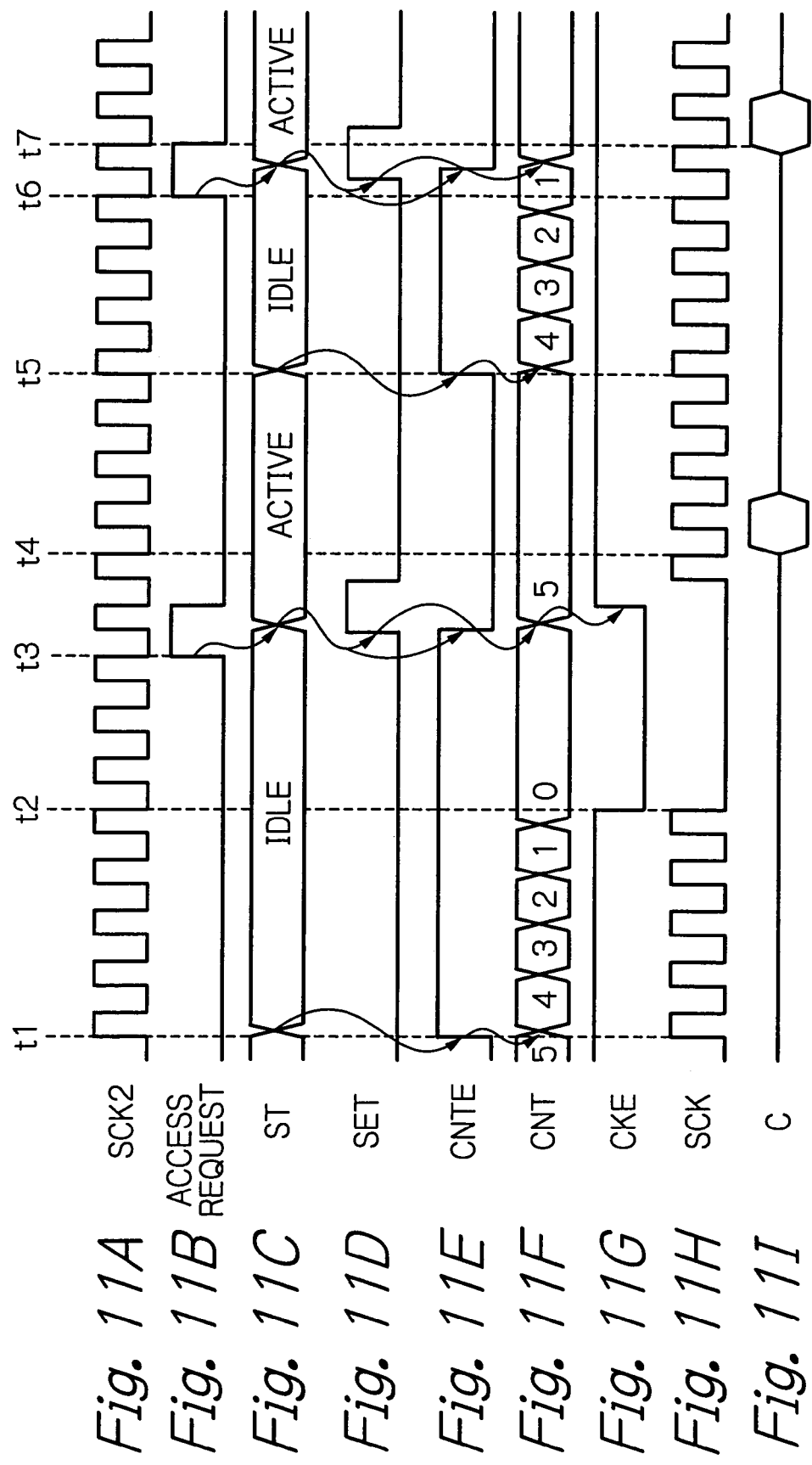
FIGS. 11A through 11I are timing diagrams for explaining the operation of the memory control unit of FIG. 10.

Next, at time t2, when the idle time count CNT reaches "0" as shown in FIG. 11F, the clock enable signal CKE is switched from high (="1") to low (="0") as shown in FIG. 11G. As a result, the switched ON/OFF clock signal SCK is fixed at "0" as shown in FIG. 11I, and simultaneously, the down counter 231B stops its operation, thus maintaining the idle time count CNT at "0".

Next, at time t3, as shown in FIG. 11B, an access request signal from the host 1 occurs. Therefore, the command generating section 21 puts the status signal ST in an active state as shown in FIG. 11C. As a result, the status monitoring section 22 makes the set signal SET high (="1") as shown in FIG. 11D, and the count enable signal CNTE low (="0") as shown in FIG. 1E, so that "5" is set the idle time count CNT as shown in FIG. 11F, so that the clock enable signal CKE is activated (="1") as shown in FIG. 11G. Thus, as shown in FIG. 11H, the switched ON/OFF clock signal generating section 24 passes the source clock signal SCK2 as the switched ON/OFF clock signal SCK.

Next, at time t4, the command generating section 21 transmits a command signal C to the SDRAM unit 3'. As a result, a burst of read operations, write operations or refresh operations are performed upon the SDRAM unit 3' in accordance with the command signal C.

Next, at time t5, after the access request signal occurred at time t3 is processed, the command generating section 21 puts the status signal ST in an idle state as shown in FIG. 1C. As a result, the status monitoring section 22 activates the count enable signal CNTE as shown in FIG. 1E, so that the down counter 231B counts pulses of the source clock signal SCK2 as shown in FIG. 11A to increase the idle time count CNT as shown in FIG. 11F.

Next, at time t6, before the idle time count CNT reaches "0" as shown in FIG. 11F, an access request signal as shown in FIG. 11B occurs. In this case, the clock enable signal CKE is maintained at a high level (="1") as shown in FIG. 11G. As a result, the switched ON/OFF clock signal SCK is still switched ON as shown in FIG. 11I. That is, the command generating section 21 puts the status signal ST in an active state as shown in FIG. 1C. As a result, the status monitoring section 22 makes the set signal SET high (="1") as shown in FIG. 11D, and the count enable signal CNTE low (="0") as shown in FIG. 11E, so that the idle time count CNT is reset as shown in FIG. 11F, so that the clock enable signal CKE is maintained at a high level (="1") as shown in FIG. 11G. Thus, as shown in FIG. 11H, the switched ON/OFF clock signal generating section 24 continues to pass the source clock signal SCK2 as the switched ON/OFF clock signal SCK.

Next, at time t7, the command generating section 21 transmits a command signal C to the SDRAM unit 3'. As a result, a burst of read operations, write operations or refresh operations are performed upon the SDRAM unit 3' in accordance with the command signal C. In this case, since the switched ON/OFF clock signal SCK is not switched OFF, the command signal C can be generated earlier. Therefore, the generation of overhead due to the ON/OFF operations of the switched ON/OFF clock signal SCK can be suppressed.

Figure 12:
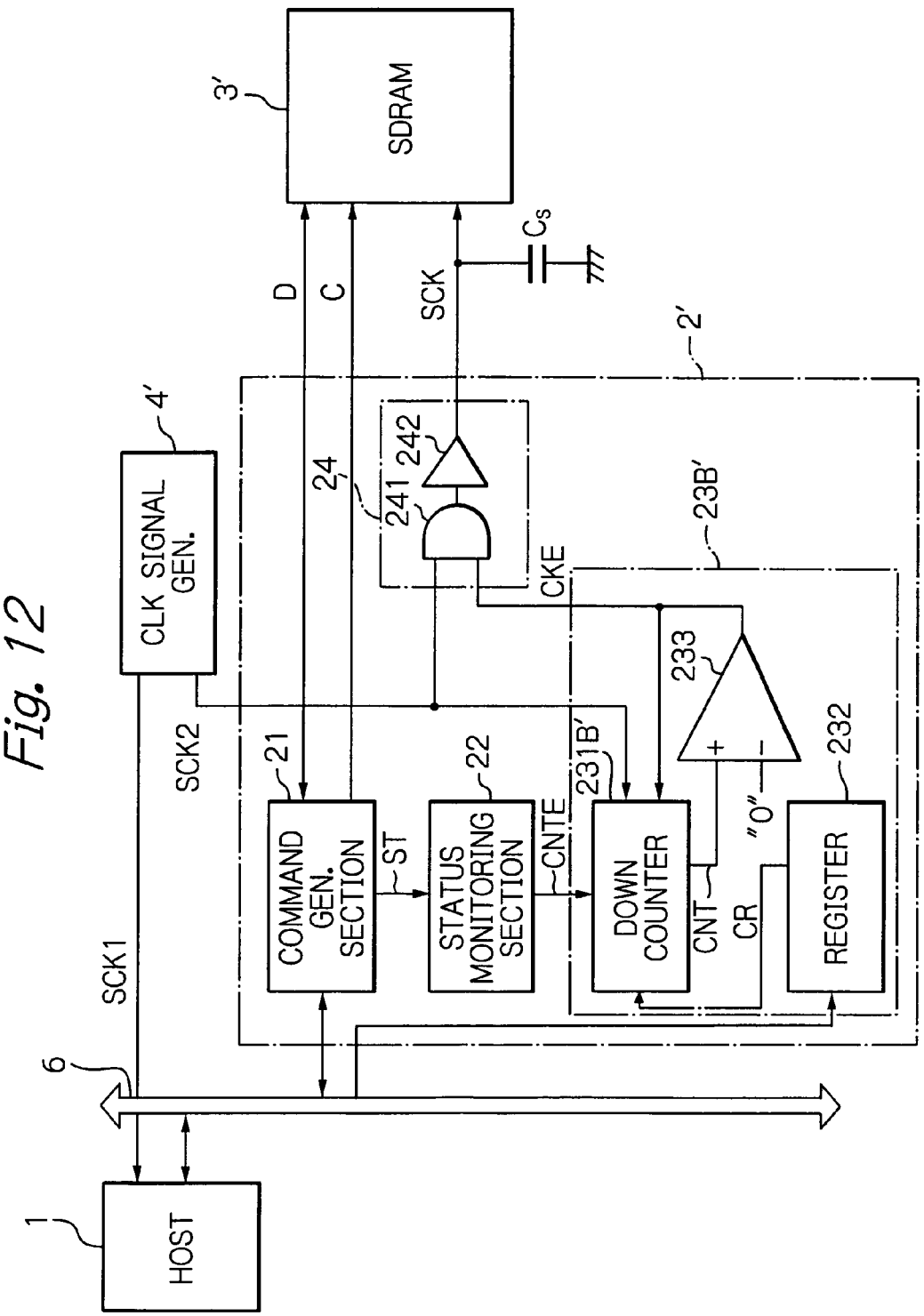
FIG. 12 is a detailed block circuit diagram of a fifth example of the memory control unit of FIG. 3.

In FIG. 12, which is a detailed block circuit diagram of a fifth example of the memory control unit 2' of FIG. 3, the status monitoring section 22 of FIG. 10 is replaced by a status monitoring section 22' which generates only the count enable signal CNTE without the set signal SET, and the idle time calculating section 23B of FIG. 10 is replaced by an idle time calculating section 23B' where the down counter 231B of FIG. 10 is replaced by a down counter 231B' in which "5" is set by the count enable signal CNTE which is at a low level (="0"). The operation of the memory control unit 2' of FIG. 12 is similar to that of FIG. 10.

Figure 13:
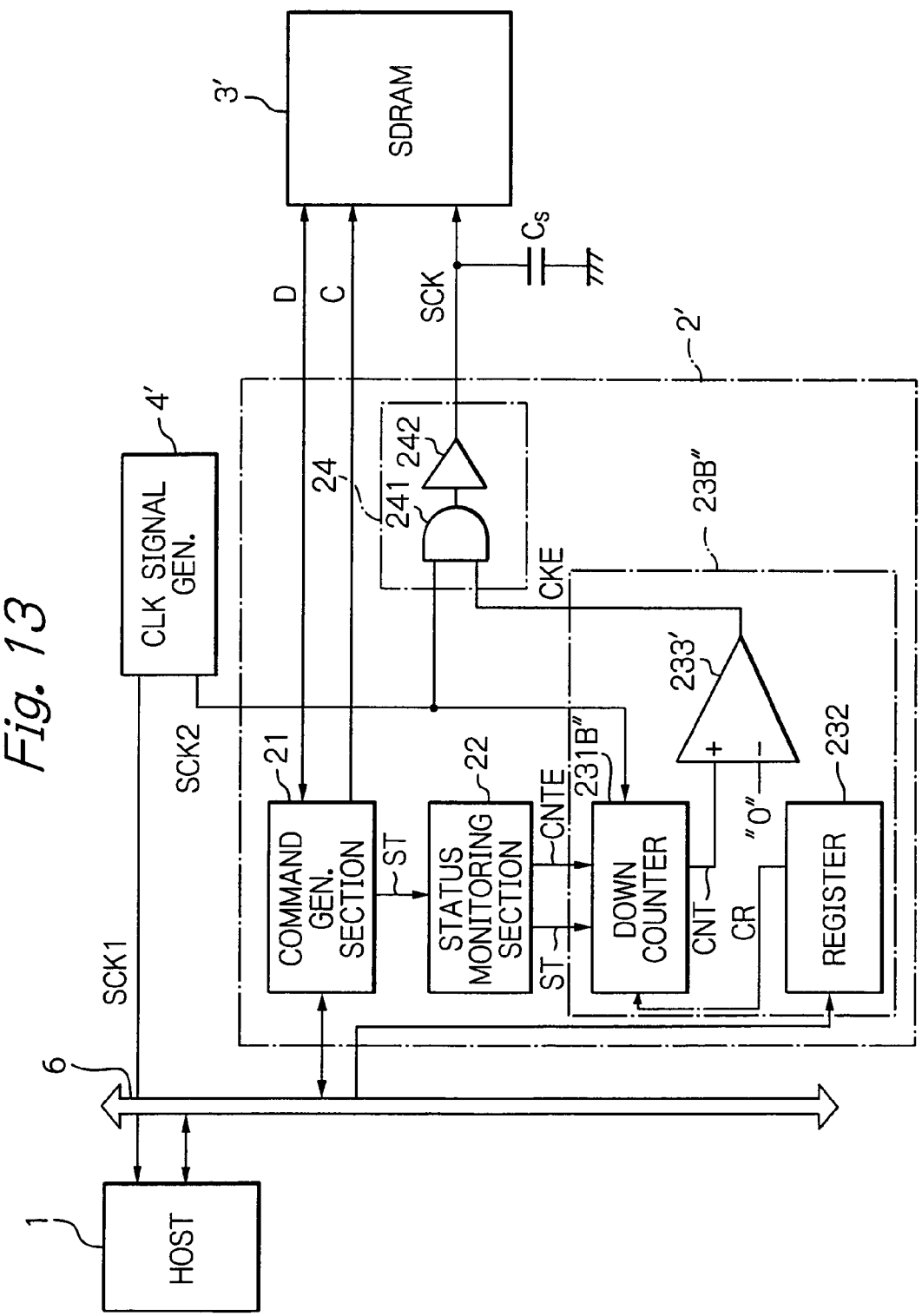
FIG. 13 is a detailed block circuit diagram of a sixth example of the memory control unit of FIG. 3.
Figure 14:
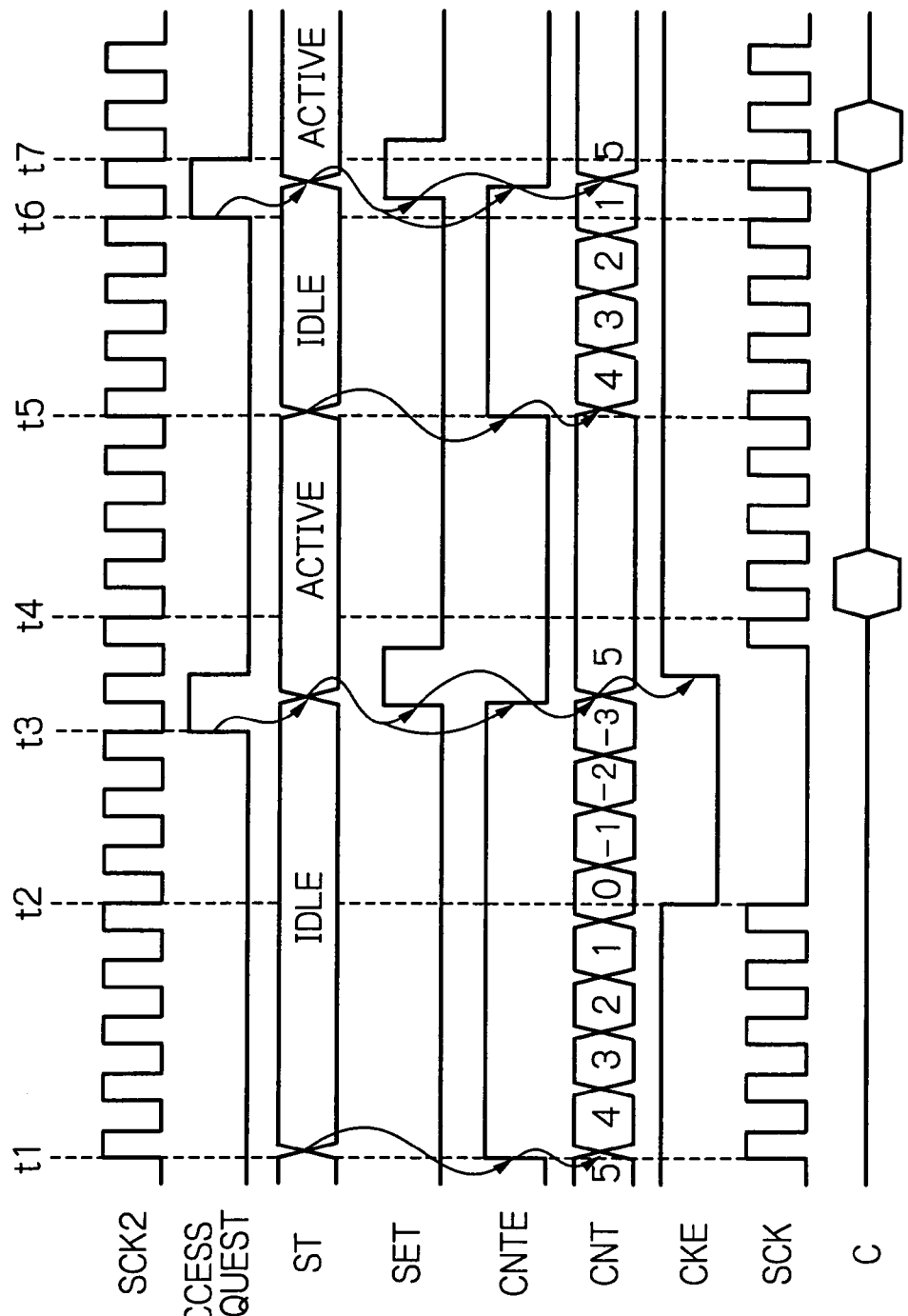
FIGS. 14A through 14I are timing diagrams for explaining the operation of the memory control unit of FIG. 12.

In FIG. 13, which is a detailed block circuit diagram of a sixth example of the memory control unit 2' of FIG. 3, the idle time calculating section 23B of FIG. 10 is replaced by an idle time calculating section 23B" where the down counter 231B of FIG. 10 is replaced by a down counter 231B" which does not stop its operation even when the clock enable signal CKE which is at a low level (="0"). That is, if the minimum value of the down counter 231B", which is in this case negative, is much smaller than an expected minimum value of the idle time count CNT, the stop operation of the down counter 231B" would be unnecessary. In this case, as shown in FIGS. 14A through 14I, the idle time count CNT continues to decrease until the idle time count CNT is set by the set signal SET.

Note that a modification portion of the fourth example of the memory control unit 2' in FIG. 13 can also be applied to the fifth example of the memory control unit 2' of FIG. 12.

In FIGS. 10, 12 and 13, the comparator 233 can be deleted; in this case, a carry signal of the down counter 231B is used as the clock enable signal CKE.

In the above-described embodiment, even when access request signals often occur at short time periods from the host 1 to the memory control unit 2', the switched ON/OFF clock signal SCK is successively switched ON so as to avoid overhead due to the restart of switched clock signals. Also, the reference value CR stored in the register 232 can be adjusted from the host 1 so as to be suitable for the data processing apparatus. However, in a special case, note that the reference value CR can be "0".

Also, in FIG. 3, since the stray capacitance $C_S$ associated with the connection between the memory control unit 2' and the SDRAM unit 3' does not involve such a large power consumption, the distance therebetween can be large. For example, as illustrated in FIG. 15, another peripheral circuit 5' can be interposed between the memory control unit 2' and the SDRAM unit 3'.

Figure 15:
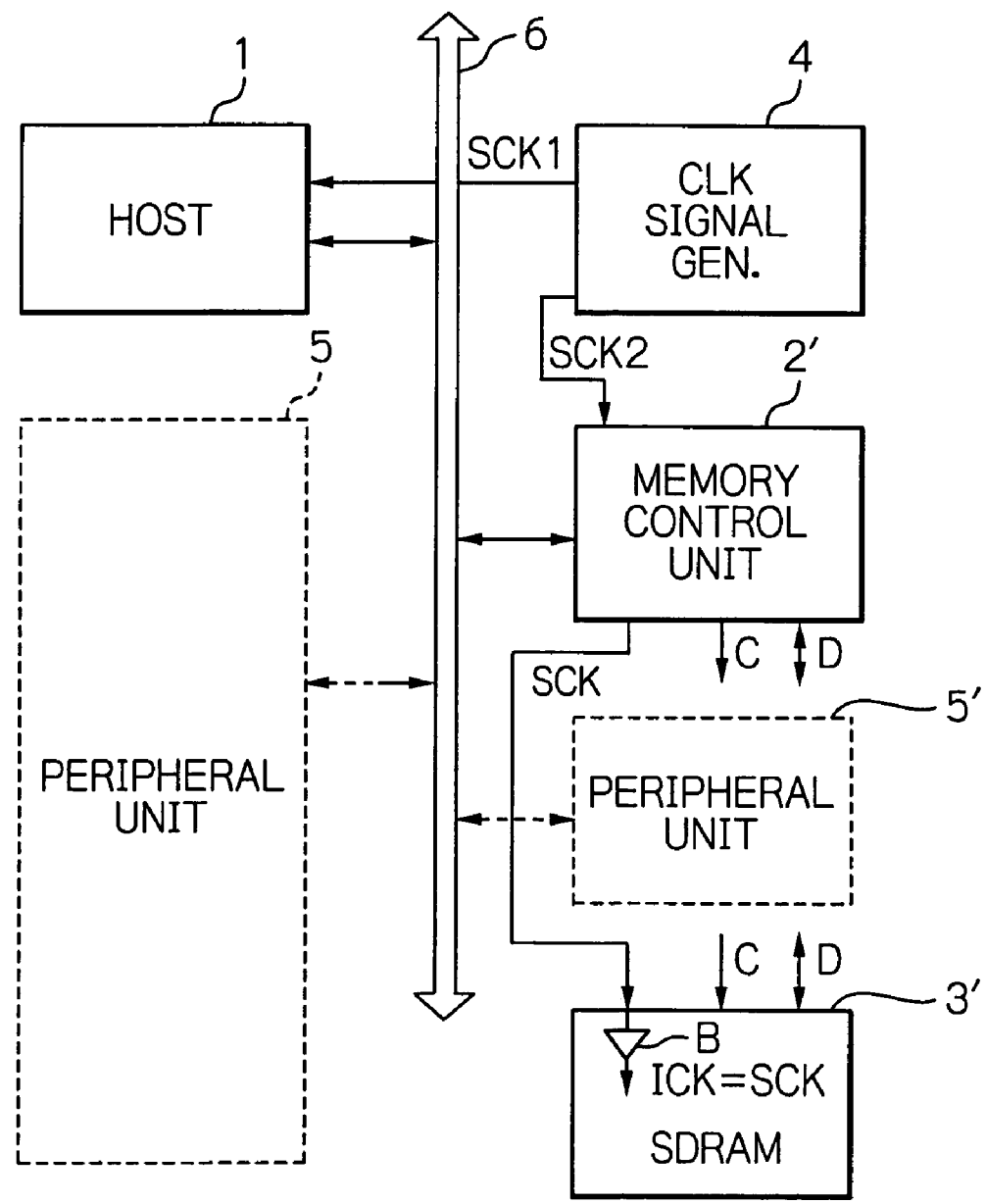
FIG. 15 is a block circuit diagram illustrating a modification of the data processing apparatus of FIG. 3.

Further, in FIGS. 3 and 15, the host 1, the memory control unit 2', the SDRAM unit 3', the clock signal generator 4' and the peripheral unit 5 (5') can be incorporated into one semiconductor chip.

As explained hereinabove, according to the present invention, since there is no connection between the clock signal generator and the synchronous memory unit, the power consumption can be decreased.

The invention claimed is:

1. A memory control apparatus for controlling a synchronous memory unit, wherein said apparatus receives a source clock signal, switches ON and OFF said source clock signal in accordance with an access request signal to said synchronous memory unit and an idle state with no access request signal, and transmits said switched ON/OFF source clock signal to said synchronous memory unit, so that said switched ON/OFF source clock signal serves as an internal clock signal within said synchronous memory unit.

2. The memory control apparatus as set forth in claim 1, wherein said source clock signal is switched OFF after said idle state has continued for a time period longer than a predetermined time period.

3. A memory control apparatus for controlling a synchronous memory unit comprising:
   a status monitoring section for monitoring whether or not an access request signal to said synchronous memory unit has been received by said apparatus;
   an idle time calculating section connected to said status monitoring section, said idle time calculating section being adapted to generate a clock enable signal from a timing when said apparatus has received said access request signal to a timing when a time period of an idle state with no access request signal has continued for a time period longer than a predetermined time period; and
   a switched ON/OFF clock signal generating section connected to said idle time calculating section, said switched ON/OFF clock signal generating section being adapted to switch ON and OFF said source clock signal in accordance with said clock enable signal to generate a switched ON/OFF clock signal and transmit said switched ON/OFF clock signal to said synchronous memory unit, so that said switched ON/Off clock signal serves as an internal clock signal within said synchronous memory unit.

4. The memory control apparatus as set forth in claim 3, wherein said idle time calculating section comprises:
- an up counter connected to said status monitoring section, a content of said up counter being incremented by counting pulses of said source clock signal in said idle state, said up counter being reset when said access request signal is received by said apparatus;
- a register adapted to store a value corresponding to said predetermined time period; and
- a comparator connected to said up counter and said register, said comparator being adapted to compare the content of said up counter with the value of said register to generate said clock enable signal when the content of said up counter is smaller than the value of said register.

5. The memory control apparatus as set forth in claim 4, wherein the content of said up counter is maintained at the same value when said clock enable signal is not generated.

6. The memory control apparatus as set forth in claim 3, wherein said idle time calculating section comprises:
- a down counter connected to said status monitoring section, a content of said up counter being decremented by counting pulses of said source clock signal in said idle state;
- a register connected to said down counter, said register being adapted to store a value corresponding to said predetermined time period, said value being set in said down counter when said access request signal is received by said apparatus;
- a comparator connected to said down counter, said comparator being adapted to compare the content of said down counter with a predetermined value to generate said clock enable signal when the content of said down counter is larger than said predetermined value.

7. The memory control apparatus as set forth in claim 6, wherein the content of said down counter is maintained at the same value when said clock enable signal is not generated.

8. A data processing apparatus comprising:
- a host;
- a memory control unit;
- a synchronous memory unit;
- a clock signal generator for supplying first and second source clock signals to said host and said memory control unit, respectively; and
- a bus connected between said host and said memory control unit, said memory control unit receiving said second source clock signal from said clock signal generator, switching ON and OFF said source clock signal in accordance with an access request signal from said host via said bus to said synchronous memory unit and an idle state with no access request signal, and transmitting said switched ON/OFF second source clock signal to said synchronous memory unit, so that said switched ON/OFF second source clock signal serves as an internal clock signal within said synchronous memory unit.

9. The data processing apparatus as set forth in claim 8, wherein said switched ON and OFF second source clock signal is switched OFF after said idle state has continued for a time period longer than a predetermined time period.

10. A data processing apparatus comprising:
- a host;
- a memory control unit;
- a synchronous memory unit;
- a clock signal generator for supplying first and second source clock signals to said host and said memory control unit, respectively; and
- a bus connected between said host and said memory control unit, said memory control unit comprising:
- a status monitoring section for monitoring whether or not an access request signal from said host via said bus to said synchronous memory unit has been received by said memory control unit;
- an idle time calculating section connected to said status monitoring section, said idle time calculating section being adapted to generate a clock enable signal from a timing when said memory control unit has received said access request signal to a timing when a time period of an idle state with no access request signal has continued for a time period longer than a predetermined time period; and
- a switched ON/OFF clock signal generating section connected to said idle time calculating section, said switched ON/OFF clock signal generating section being adapted to switch ON and OFF said second source clock signal in accordance with said clock enable signal to generate a switched ON/OFF second clock signal and transmit said switched ON/OFF second clock signal to said synchronous memory unit, so that said switched ON/OFF second clock signal serves as an internal clock signal within said synchronous memory unit.

11. The data processing apparatus as set forth in claim 10, wherein said idle time calculating section comprises:
- an up counter connected to said status monitoring section, a content of said up counter being incremented by counting pulses of said second source clock signal in said idle state, said up counter being reset when said access request signal is received by said memory control unit;
- a register adapted to store a value corresponding to said predetermined time period; and
- a comparator connected to said up counter and said register, said comparator being adapted to compare the content of said up counter with the value of said register to generate said clock enable signal when the content of said up counter is smaller than the value of said register.

12. The data processing apparatus as set forth in claim 11, wherein the content of said up counter is maintained at the same value when said clock enable signal is not generated.

13. The memory control apparatus as set forth in claim 10, wherein said idle time calculating section comprises:
- a down counter connected to said status monitoring section, a content of said up counter being decremented by counting pulses of said second source clock signal in said idle state;
- a register connected to said down counter, said register being adapted to store a value corresponding to said predetermined time period, said value being set in said down counter when said access request signal is received by said memory control unit;
- a comparator connected to said down counter, said comparator being adapted to compare the content of said down counter with a predetermined value to generate said clock enable signal when the content of said down counter is larger than said predetermined value.

14. The data processing apparatus as set forth in claim 13, wherein the content of said down counter is maintained at the same value when said clock enable signal is not generated.

* * * * *